(12) United States Patent
Sicard

(10) Patent No.: US 8,531,324 B2
(45) Date of Patent: Sep. 10, 2013

(54) SYSTEMS AND METHODS FOR DATA CONVERSION

(75) Inventor: Thierry Sicard, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 43 days.

(21) Appl. No.: 13/186,091

(22) Filed: Jul. 19, 2011

(65) Prior Publication Data

US 2013/0021190 A1    Jan. 24, 2013

(51) Int. Cl.
 *H03M 1/06* (2006.01)

(52) U.S. Cl.
 USPC ........... 341/118; 341/119; 341/120; 341/155; 341/172

(58) Field of Classification Search
 USPC .................. 341/118, 120, 122, 143, 155, 172
 See application file for complete search history.

(56) References Cited

U.S. PATENT DOCUMENTS

| | | | | |
|---|---|---|---|---|
| 4,988,900 | A * | 1/1991 | Fensch | 327/337 |
| 5,600,322 | A * | 2/1997 | Garavan | 341/172 |
| 5,659,314 | A | 8/1997 | Tokura et al. | |
| 5,729,232 | A | 3/1998 | Fujimori | |
| 5,841,310 | A | 11/1998 | Kalthoff et al. | |
| 6,535,039 | B2 * | 3/2003 | Nanba et al. | 327/170 |
| 6,608,575 | B2 | 8/2003 | Bazarjani | |
| 6,653,967 | B2 | 11/2003 | Hamashita | |
| 7,242,333 | B1 | 7/2007 | Wu | |
| 7,380,756 | B1 * | 6/2008 | Enloe et al. | 244/175 |
| 7,589,658 | B2 | 9/2009 | Ren et al. | |
| 7,663,424 | B2 | 2/2010 | Stulik | |
| 7,982,526 | B2 * | 7/2011 | Lee | 327/337 |
| 8,217,821 | B2 * | 7/2012 | David et al. | 341/155 |
| 2003/0020530 | A1 | 1/2003 | Lee et al. | |
| 2005/0156657 | A1 | 7/2005 | Budak et al. | |
| 2008/0012741 | A1 | 1/2008 | Nakata et al. | |
| 2008/0042890 | A1 * | 2/2008 | Cho | 341/161 |
| 2010/0026542 | A1 * | 2/2010 | Wang et al. | 341/155 |
| 2010/0225515 | A1 * | 9/2010 | Lee et al. | 341/122 |

OTHER PUBLICATIONS

U.S. Appl. No. 13/186,106, Sicard, T., "Systems and Methods for Data Conversion", filed Jul. 19, 2011,—Office Action, Notice of Allowance, mailed Jan. 4, 2013.

* cited by examiner

*Primary Examiner* — Linh Nguyen
(74) *Attorney, Agent, or Firm* — Mary Jo Bertani

(57) ABSTRACT

Systems and methods are provided for converting analog data to digital data that can include performing N successive analog subtractions from an initial data charge Qin. The analog subtractions are performed using an amplifier coupled to a discharge capacitor and a divider circuit coupled to an input of the amplifier. The divider circuit includes a first capacitor, a second capacitor, and a switch to alternately divide a remaining charge Q by $2^N$ between the first and second capacitors until the remaining charge Qin at the amplifier is below a threshold value. A compensating circuit compensates for fluctuations in the charge held by the first and second capacitors due to operation of the switch.

18 Claims, 7 Drawing Sheets

SYSTEMS AND METHODS FOR DATA CONVERSION

CROSS-REFERENCE TO RELATED APPLICATION(S)

This application is related to U.S. patent application Ser. No. 13/186,106, filed on even date, entitled "Systems and Methods For Data Conversion," naming Thierry Sicard as inventor, and assigned to the current assignee hereof.

BACKGROUND

1. Field

This disclosure relates generally to electrical circuitry, and more specifically, to electrical circuitry for data conversion.

2. Related Art

Data converters are very useful for converting analog signals to digital signals, and for converting digital signals to analog signals. Many applications require data converters that have a high resolution, fast conversion time, allow a broad range of inputs, and yet are cost effective. Other data conversion features may also be important for various applications. It is thus important to be able to provide data converters that meet a wide variety of potentially conflicting criteria, while at the same time remain cost effective.

Analog MOS circuits such as switched-capacitor circuits often employed in analog to digital converters use charge to represent analog data. In such circuits, analog signals are converted from the voltage domain into the charge domain by applying a voltage to a capacitor through an MOS switch such as a field effect transistor. With the switch closed, an input voltage produces a charge on the top plate of the capacitor. If the switch is subsequently opened (by dropping the gate voltage below threshold), this charge will ideally remain on the capacitor. The principal limitations to the accuracy of this scheme come from the MOS switch. When the MOS switch is turned on, it generates thermal noise that causes random fluctuations in the device's drain current. The variations are continuously integrated by the capacitor. When the MOS switch is turned off, the integral of the noise current is "sampled" onto the capacitor. Thus an error component is added to the signal charge.

When the MOS switch turns off, another error source referred to as charge injection is caused by the mobile charge in the MOS switch's inversion layer, which is forced to leave the channel when the gate voltage changes. Any inversion charge that escapes to the data node can cause an additional error in the stored charge.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
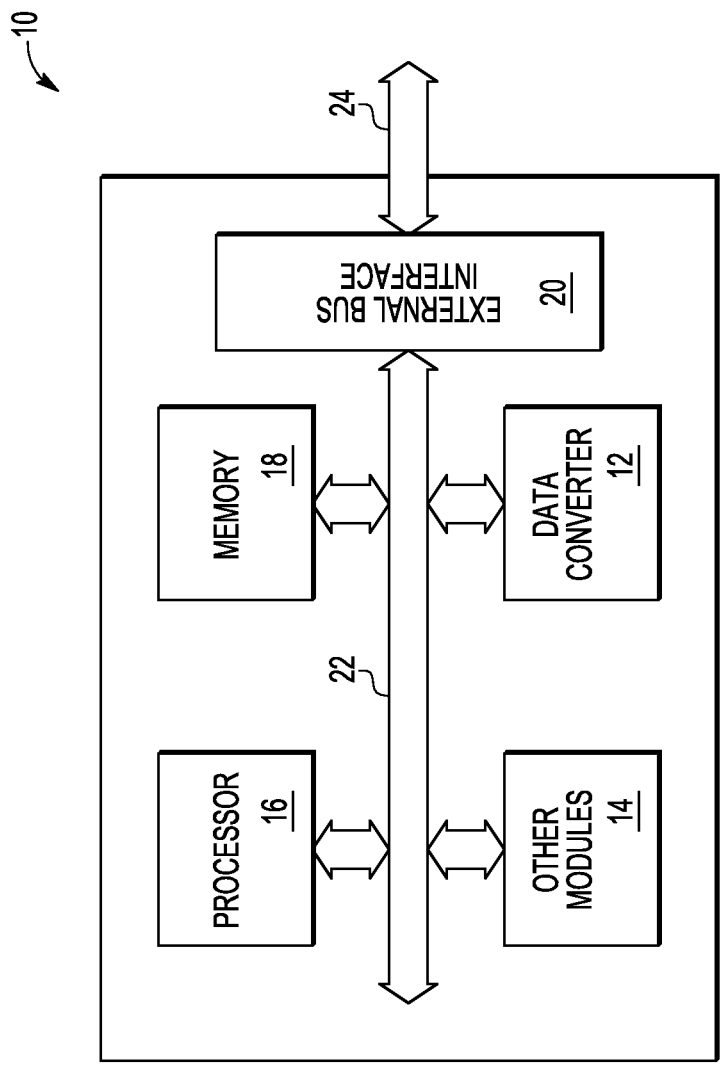
FIG. 1 illustrates, in block diagram form, a processing system in accordance with one embodiment.

FIG. 1 illustrates one embodiment of a processing system 10. In alternate embodiments, system 10 may be implemented as a semiconductor device as a single integrated circuit, may be implemented as a plurality of integrated circuits, or may be implemented as a combination of integrated circuits and discrete components. Alternate embodiments may implement system 10 in any manner.

In one embodiment, system 10 comprises data converter 12, other modules 14, processor 16, memory 18, and external bus interface 20, which are all bi-directionally coupled to each other by way of a bus 22 or a plurality of electrical signals 22. In one embodiment, system 10 can receive inputs and provide outputs by way of a bus 24 or a plurality of electrical signals 24 coupled to external bus interface 20. In alternate embodiments, system 10 may comprises fewer, more, or different blocks of circuitry than those illustrated in FIG. 1.

Figure 2:
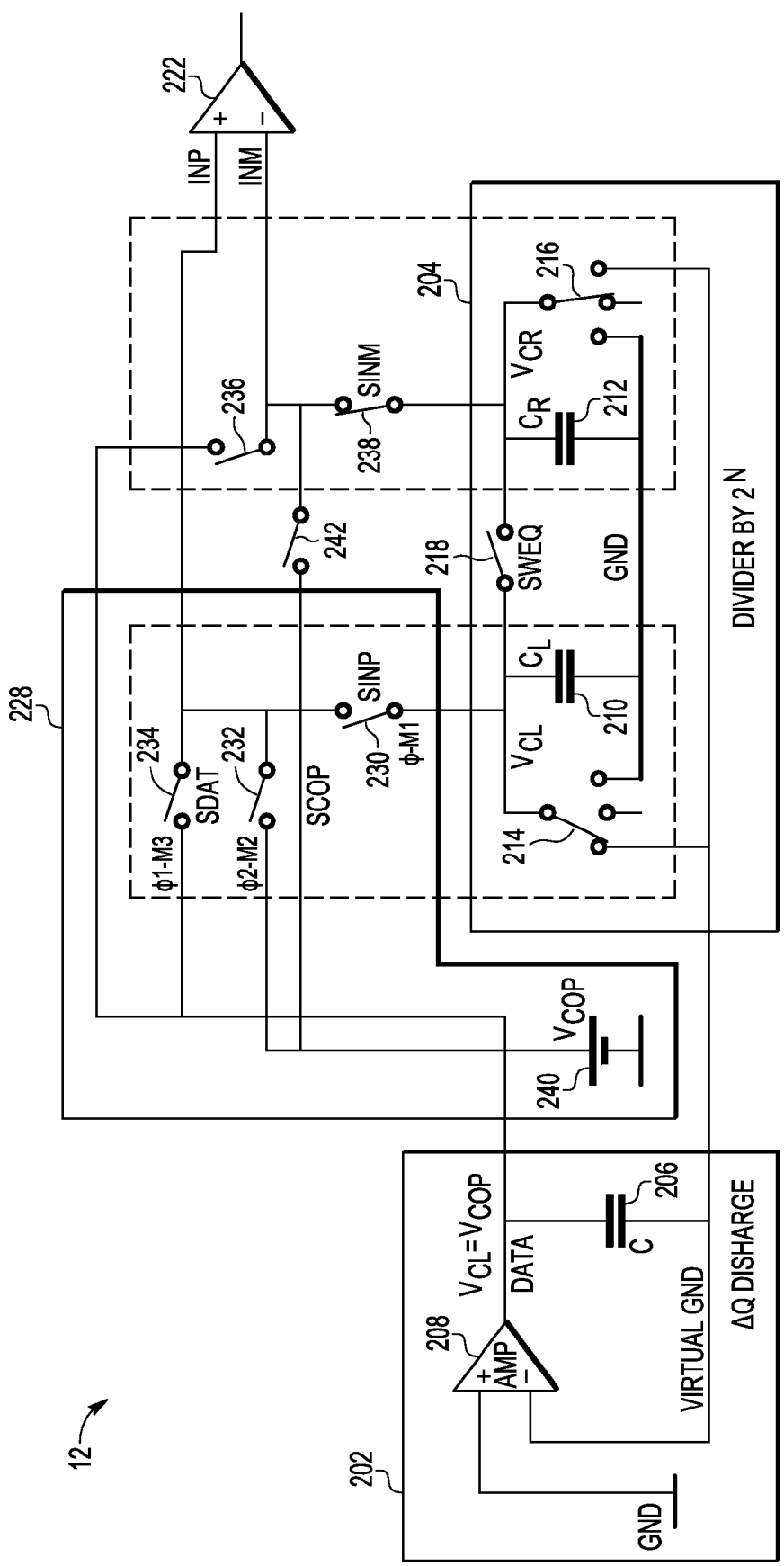
FIG. 2 illustrates, in schematic form, a portion of a data converter in accordance with one embodiment.

FIG. 2 illustrates, in schematic form, a portion of a data converter 12 in accordance with some embodiments that includes a discharge circuit 202 and a divider circuit 204 coupled to discharge circuit 202 via a first ground level VG. Discharge circuit 202 includes an amplifier 208 and a discharge capacitor 206. A first input of amplifier 208 is coupled to first ground level VG. Discharge capacitor 206 is coupled between an output of amplifier 208 and first ground level VG. Capacitors 206, 210, 212 are the same size or capacitance value (within manufacturing tolerances).

Divider circuit 204 includes a first divider capacitor 210, a first divider switch 214 coupled in parallel to first divider capacitor 210, a second divider capacitor 212 coupled in parallel to first divider capacitor 210, second divider switch 216 coupled in parallel to the second divider capacitor 212, and a third divider switch 218 coupled in series between first divider capacitor 210 and second divider capacitor 212. First divider switch 214 is coupled between first ground level VG and third divider switch 218, second divider switch 216 is coupled between the first ground level and the third divider switch 218, and first and second divider capacitors 210, 212 are coupled between a second ground level G and third divider switch 218.

Data converter 12 further includes a comparator 222 that has a first input coupled to the output of amplifier 208 and a second input coupled to an output of divider circuit 204. A fourth switch 242 is coupled to the second comparator input. Fourth switch 242 includes one terminal coupled to voltage supply 240 and another terminal coupled to the m-input to comparator 222.

First and second divider switches 214, 216 can operate between respective first, second and/or third positions. The first position couples the first and second divider switches 214, 216 to first ground level VG, the second position couples first and second divider switches 214, 216 to the second ground level G, and the third position couples first and second divider switches 214, 216 to a neutral position between the first and second ground positions. Switch 232 can be operated to make divider circuit 204 symmetric by bringing the same capacitive load to both divider capacitors 210, 212 when switch 218 is closed.

Another power supply (not shown) can be coupled to divider circuit 204 to pre-charge capacitor 212 during initialization. The power supply can be coupled in parallel with capacitors 210, 212 and switches 214, 216. An initialization switch (not shown) can be included to connect the power supply to divider circuit 204 during initialization and to disconnect the power supply after initialization.

Charge injection compensation circuit 228 is coupled to discharge circuit 202 and divider circuit 204. In the embodiment shown, charge injection compensation circuit 228 includes voltage source 240 coupled in parallel to first divider capacitor 210, a p-input switch 230 coupled between a p-input to comparator 222 and divider capacitor 210, a m-input switch 238 coupled between a m-input to comparator 222 and divider capacitor 212, copy switch 232 coupled in series between the voltage source 240 and p-input to comparator 222 between p-input switch 230 and data switch 234, data switch 234 coupled in series between the output of amplifier 208 and the p-input to comparator 222, and second copy switch 240 coupled in series between the voltage source 240 and m-input to comparator 222. Switch 236 is coupled between m-input switch 238 and the output of amplifier 208 to connect or disconnect amplifier 208 from the m-input to comparator 222.

Figure 3:
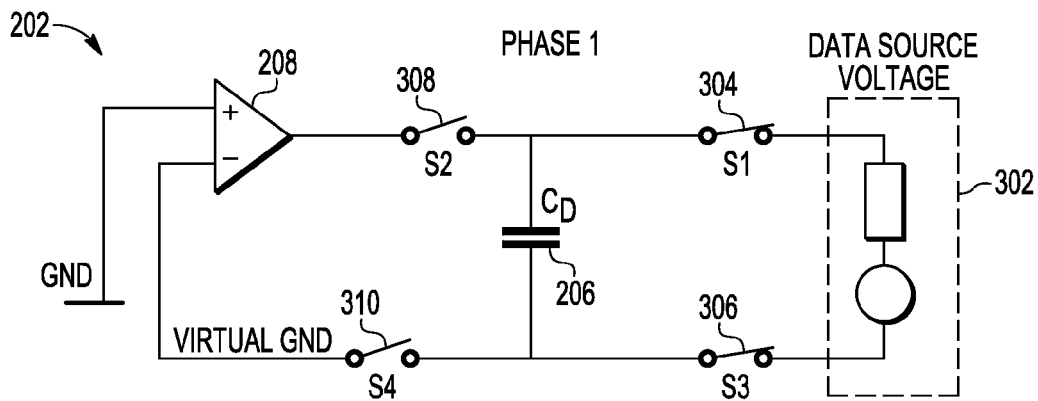
FIGS. 3-5 illustrate, in schematic diagram form, a precharge portion of the data converter of FIGS. 1 and 2 in accordance with one embodiment.
Figure 4:
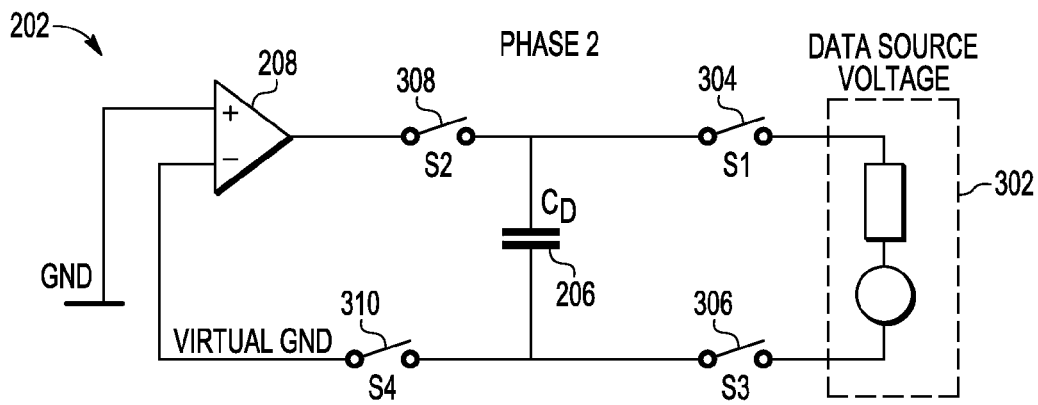
Figure 5:
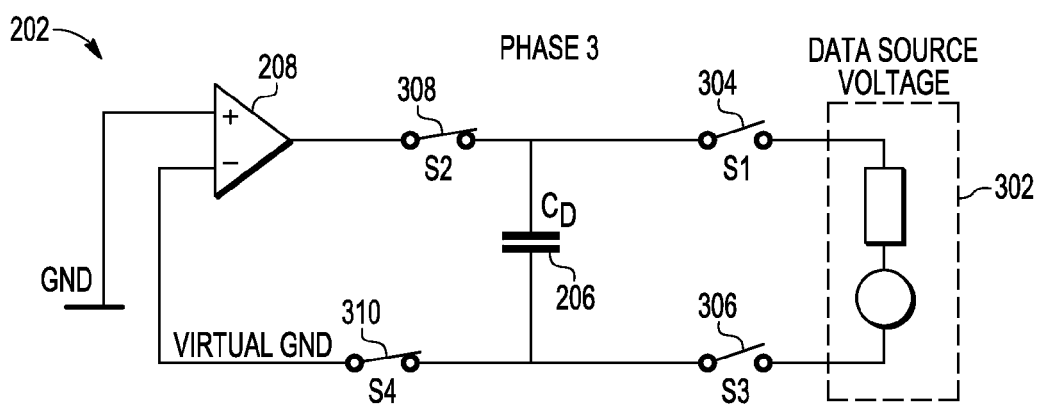

FIGS. 3-5 illustrate, in schematic diagram form, an example of a pre-charge portion for discharge circuit 202 of data converter 12 of FIGS. 1 and 2 including a voltage source 302 coupled in parallel with discharge capacitor 206. A first discharge switch 304 coupled in series with the output of amplifier 208 and between discharge capacitor 206 and voltage source 302. A second discharge switch 306 is coupled in series with the first input to amplifier 208 and between discharge capacitor 206 and voltage source 302. A third discharge switch 308 is coupled in series with the output of amplifier 208 and between the discharge capacitor 206 and amplifier 208. A fourth discharge switch 310 is coupled in series with the first input to amplifier 208 and between discharge capacitor 206 and amplifier 208.

During a first pre-charge phase of operation as shown in FIG. 3, switches 304, 306 are closed and switches 308 and 310 are open to load discharge capacitor 208 with data voltage from voltage source 302. During a second phase of operation as shown in FIG. 4, switches 304, 306, 308, 310 are open to isolate discharge capacitor 206 from voltage source 302. During a third phase of operation as shown in FIG. 5, switches 304, 306 are open and switches 308, 310 are closed to load discharge capacitor 206 across amplifier 208.

Figure 6:
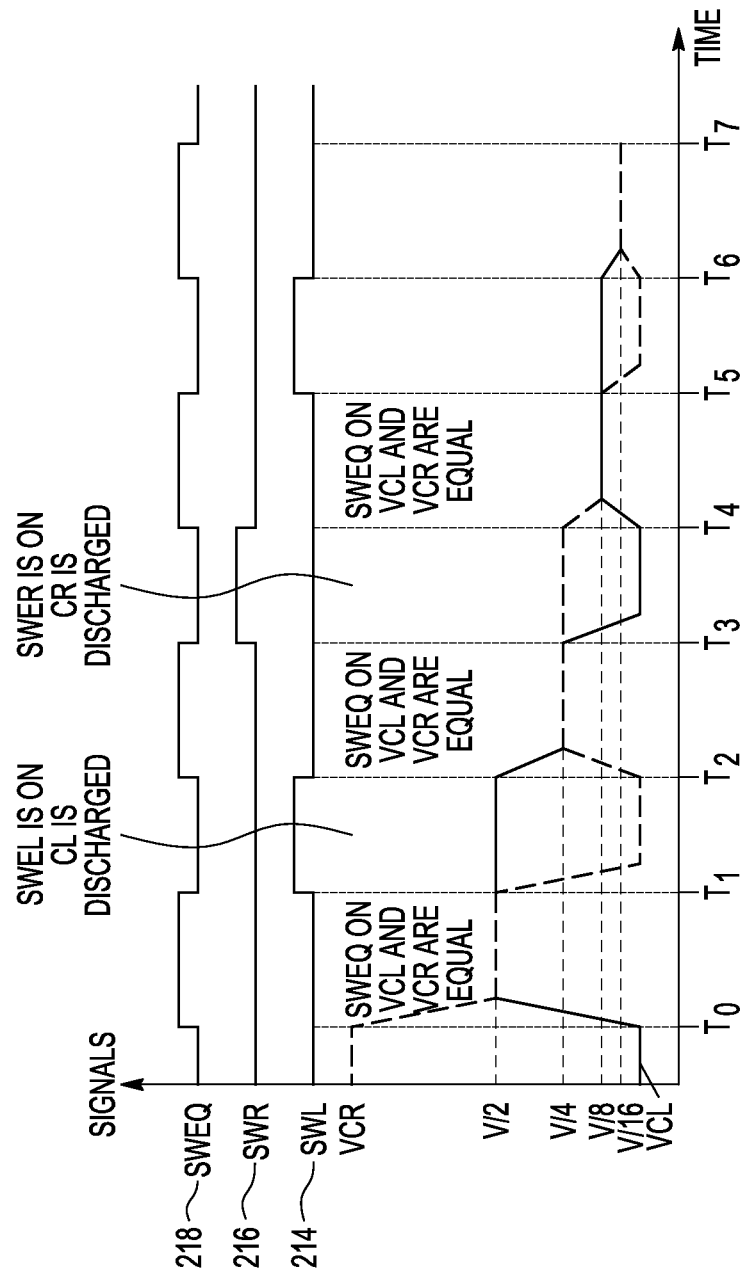
FIG. 6 illustrates, in time history diagram form, an example of the operation of switches and capacitors in the portion of the data converter of FIGS. 3-5.

FIG. 6 illustrates, in time history diagram form, an example of voltages across capacitors 210, 212 resulting from the operation of switches 214, 216, 218 in data converter 12 of FIG. 2. FIGS. 7-14 illustrate, in conjunction with FIG. 6, example of charges stored in the capacitors of the data converter 12 of FIG. 2 during operation of switches 214, 216, 218. Note that while FIGS. 7-14 show the discharge of capacitor 210 during certain phases of operation, the alternate discharge of capacitor 212 is not shown, but is similar to the discharge of capacitor 210 during alternating phases.

Figure 7:
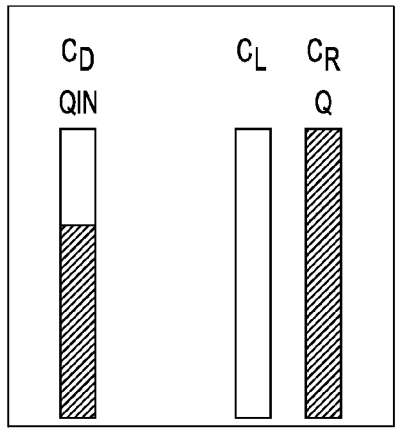
FIGS. 7-14 illustrate, in graphical form, an example of charges stored in the capacitors of the data converter of FIG. 2 during different phases of operation.

FIGS. 6 and 7 show that prior to $T_0$, discharge capacitor 206 is partially charged to input charge Qin and divider capacitor 212 is fully charged to charge Q. Divider capacitor 210 is initially discharged. When switch 218 is closed at time $T_0$, switches 214, 216 are open and since capacitors 210, 212 are approximately the same size, the charge Q from capacitor 212 is divided by two, with one half of the charge Q being transferred to capacitor 210 and the other half remaining in capacitor 212, as shown in FIG. 8.

Figure 8:
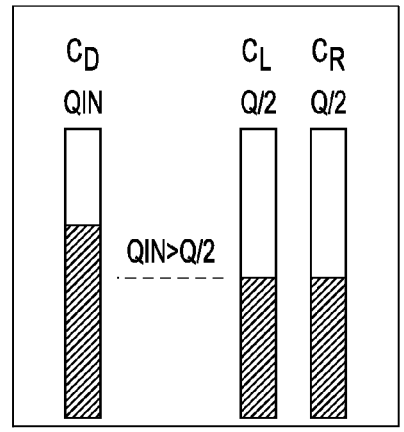
Figure 9:
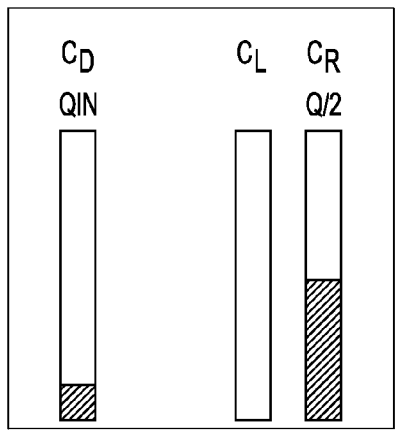

Referring to FIGS. 6, 8 and 9, when switch 218 opens at time $T_1$, switch 214 closes to connect capacitor 210 to the first ground VG. Switch 216 remains open causing capacitor 212 to retain its charge, while capacitor 210 is discharged with the switch 214 in ground G position. As shown in FIG. 9, the charge from capacitor 210 is removed from capacitor 206 via common series connection of capacitors 206, 210 to first ground VG since the charge in capacitor 206 (Qin) was greater than the charge in capacitor 210 (Q/2). With respect to comparator 222, when the charge in capacitor 206 is greater than the charge in capacitor 210, comparator 222 sets a bit for the corresponding charge level (in this case, Q/2).

Figure 10:
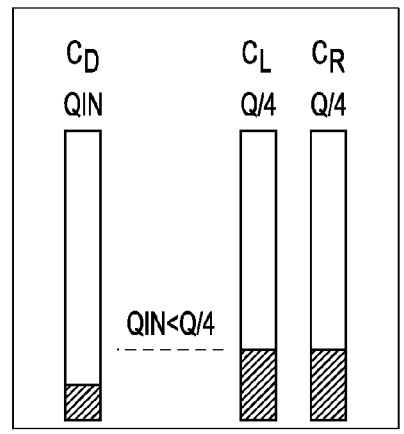

Referring to FIGS. 6, 9 and 10, when switch 218 is closed at time $T_2$, switch 214 opens and switch 216 remains open causing the remaining charge (Q/4) on capacitor 212 to be divided between capacitors 210, 212, as shown in FIG. 10.

Figure 11:
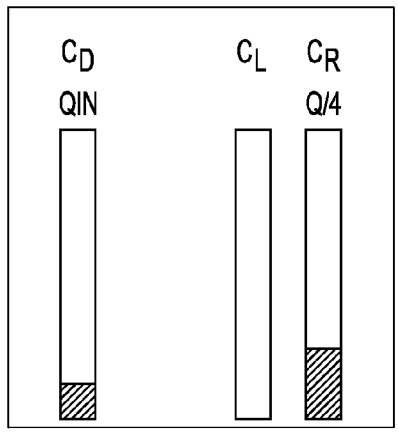

Referring to FIGS. 6, 10 and 11, when switch 218 opens at time $T_3$, switch 214 closes and switch 216 remains open causing capacitor 210 to be discharged, as shown in FIG. 11.

Figure 12:
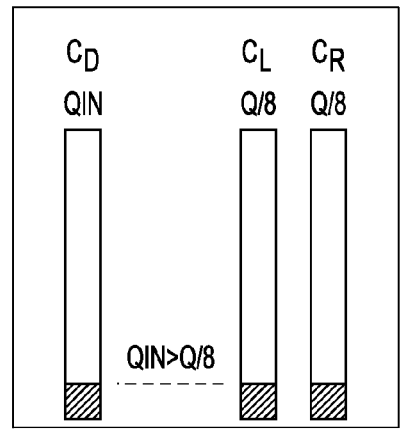

Referring to FIGS. 6, 11 and 12, when switch 218 is closed at time $T_4$, switch 216 opens and switch 214 remains open causing the remaining charge (Q/8) on capacitor 212 to be divided between capacitors 210, 212, as shown in FIG. 12.

Figure 13:
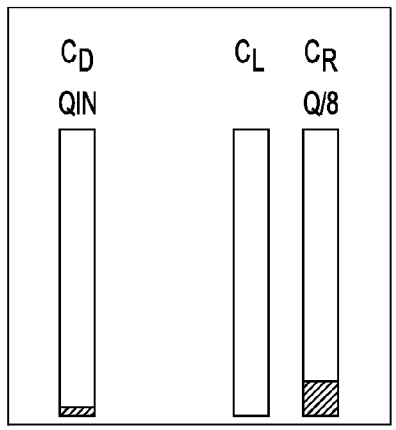

Referring to FIGS. 6, 12 and 13, when switch 218 opens at time $T_5$, switch 214 closes and switch 216 remains open causing the charge on capacitor 212 to be discharged, as shown in FIG. 13.

Figure 14:
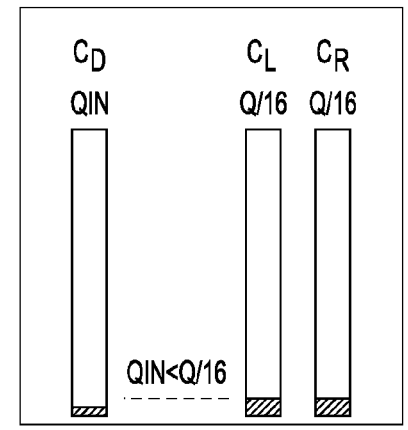

Referring to FIGS. 6, 13 and 14, when switch 218 closes at time $T_6$, switch 214 opens and switch 216 remains open causing the remaining charge (Q/16) on capacitor 212 to be divided between capacitors 210, 212, as shown in FIG. 14.

Data converter 12 solves or improves the problem of error-prone multiplication of the factor 2 (used in the $2^N$ division) that plague conventional data converters. Additionally, problems associated with achieving matching capacitors in conventional data converters (i.e., successive approximation registers) are minimized by data converter 12 that can use only three capacitors 206, 210, 212 having the same capacitance, value, or size (within limits of manufacturing tolerances). Further, capacitors 206, 210, 212 can be relatively large since there are only three of them, enabling better size matching and lower noise. As a further feature, data converter 12 is much easier to test than conventional data converters since only three capacitors 206, 210, 212 and four switches 215, 216, 218, 220 need to be tested instead of the much more numerous capacitors and switches found in conventional data converters.

As a further feature, error between capacitors 210, 212 is compensated by the alternative discharge of capacitors 210, 212 since the error is not accumulated. Additionally, all capacitors are connected to a first or second ground level, so data converter 12 does not induce parasitic capacitor with a substrate upon which semiconductor devices such as processing system 10 are fabricated. Further, switch 218 does not inject parasitic charges, because switch 218 is turned on and off before comparator 222 measures the difference between inputs.

Figure 15:
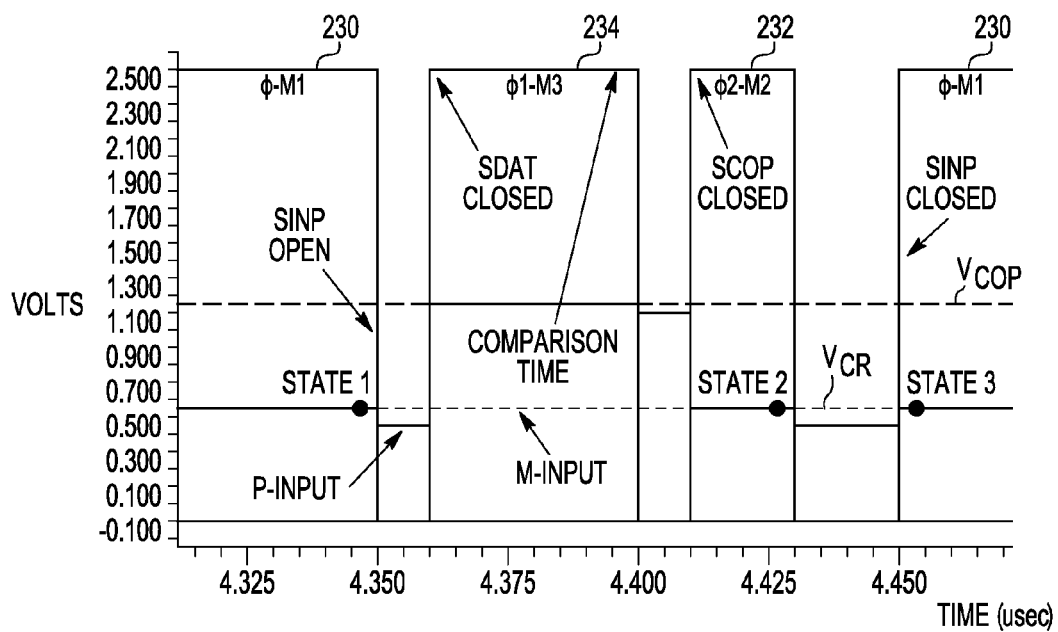
FIG. 15 illustrates, in time history diagram form, an example of the operation of switches in an embodiment of a compensation circuit of FIG. 2.

FIG. 15 illustrates, in time history diagram form, an example of the operation of switches 230, 232, 234 and a corresponding signal (Vinp) input to comparator 222 in an embodiment of a compensation circuit 228 of FIG. 2 to compensate for fluctuations in the charge held by divider capacitors 210, 212 due to operation of switches 230, 238. FIG. 15 uses an example time period from approximately 4.35 microseconds (µs) to 4.7 µs. When switch 218 is closed, charges are injected in capacitors 210, 212, so the V/2 has a charge injection error. But when switch 218 is open, the same error is generated in opposite polarity, so the V/2 voltage is corrected when switch 218 is opened. This means that the comparison and compensation occurs just after switch 218 is opened and just before switch 214 or switch 216 is closed, depending on whether the input amplifier 208 is being compared to input from voltage due to capacitor 210 or capacitor 212.

Switches 230 and 238 are closed almost all the time except being opened for a short time to compare voltages between divider circuit 204 and discharge circuit 202.

In the opposite phase, switches 234,236, 232,242 are open almost all the time except being closed for a short time to compare voltages between divider circuit 204 and discharge circuit 202, and bring the voltage of the comparator 22 input back to the value it was before opening switches 230,238.

To compensate for fluctuations in the charges stored in capacitors 210, 212 due to charge injection from operation of switches 230, 238, input switch 230 is operated during an initial phase Φ to close a connection between divider capacitor 210 and the p-input to comparator 222. To compare voltage across capacitor 212 ($V_{CR}$) with the data voltage across capacitor 206, switch 230 opens at 4.35 µs, the voltage at the p-input to comparator 222 fluctuates by some voltage level, for example, by approximately 55.7 microVolts (µV). Switch 232 is used to bring the other side of switch 230 at the same voltage as $V_{CL}$ to compensate the voltage across capacitor 210 when switch 230 is switched on again.

Opening switch 230 generates a charge injection error that is very large on the p-input to comparator 222 because the input capacitance is relatively small. When switch 230 is opened, switch 234 is closed (phase 1) to connect the p-input to comparator 222 with the data. As data voltage $V_{data}$ is a low impedance output from amplifier 208, charge injection is minimal. The data voltage $V_{data}$ is controlled so comparator 222 receives the exact value for $V_{CR}$ (no injection, because switch 238 did not move) and the exact value of Vdata (because low impedance source voltage).

So the comparison by comparator 222 shows no difference between the two signals, but some charge is injected in capacitor 210. Although the error may seem small, compensation circuit 228 is used to minimize charge errors since the least significant bit in analog to digital conversion can represent 150uV. Accordingly, allowing errors to accumulate from divider circuit 204 at each comparison could adversely affect the accuracy of data conversion.

When the comparison is completed at comparator 222, switch 234 is opened. Before switch 230 is opened, the voltage of p-input is equal to $V_{CL}$. When switch 230 is closed, p-input is connected to Vdata. Compensation circuit 228 can therefore be used to bring the voltage at p-input back to the same voltage Vcl before closing switch 230 again. When switch 230 is closed, charge will again be injected in the opposite way, compensating the injection error. Compensation circuit 228 is also used to compensate charge injection errors from operation of switch 230. Compensation circuit 238 along with switches 236, 242, and voltage supply Vcop 240 are used to compensate charge injection errors from operation of switch 238.

Figure 16:
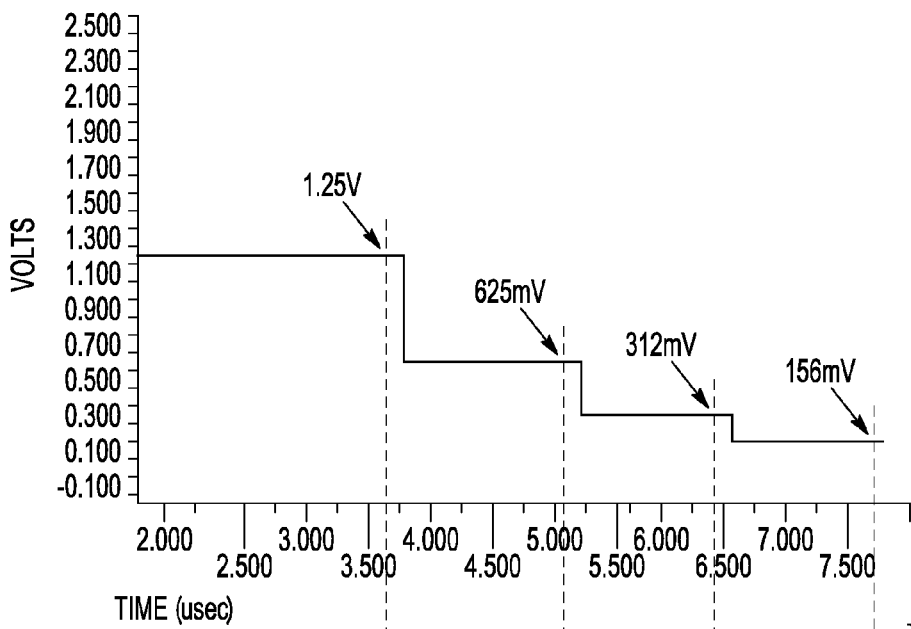
FIG. 16 illustrates, in time history diagram form, an example of voltage supplied by a voltage supply for the compensation circuit in the data converter of FIG. 2.

FIG. 16 illustrates, in time history diagram form, an example of voltage $V_{cop}$ supplied by voltage supply 240 (FIG. 2). Voltage Vcop starts at 1.25 Volts at time 1.75 µs, and steps down to 625 mV at 3.75 µs, to 312 mV at 5.2 µs, and to 156 mV at 6.6 µs. Other suitable voltage levels and time increments can be used, however.

Figure 18:
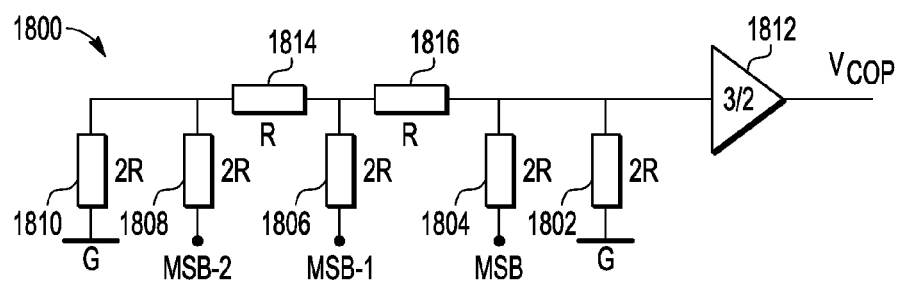
FIG. 18 shows an embodiment of a voltage divider circuit that can be used to generated voltages for the compensation circuit of FIG. 2.

An embodiment of voltage divider circuit 1800 is shown in FIG. 18 that can be used to generated voltages for voltage supply 240. Voltage divider circuit 1800 show five resistors 1802, 1804, 1806, 1808, 1810 of value 2R coupled in parallel to an input of amplifier 1812. The output of amplifier 802 is $V_{cop}$. First resistors 1802 and last resistor 1810 are coupled between ground (G) and amplifier 1812. Resistor 1804 is coupled between most significant bit (MSB) and amplifier 1812. Resistor 1806 is coupled between second most significant bit (MSB-1) and amplifier 1812. Resistor 1808 is coupled between third most significant bit (MSB-2) and amplifier 1812. Another resistor 1814 of value R is coupled in series with the input to amplifier 1812 between resistors 1808 and 1806. Still another resistor 1816 of value R is coupled in series with the input to amplifier 1812 between resistors 1806 and 1804. Other suitable circuits can be used to implement voltage supply 240.

Figure 17:
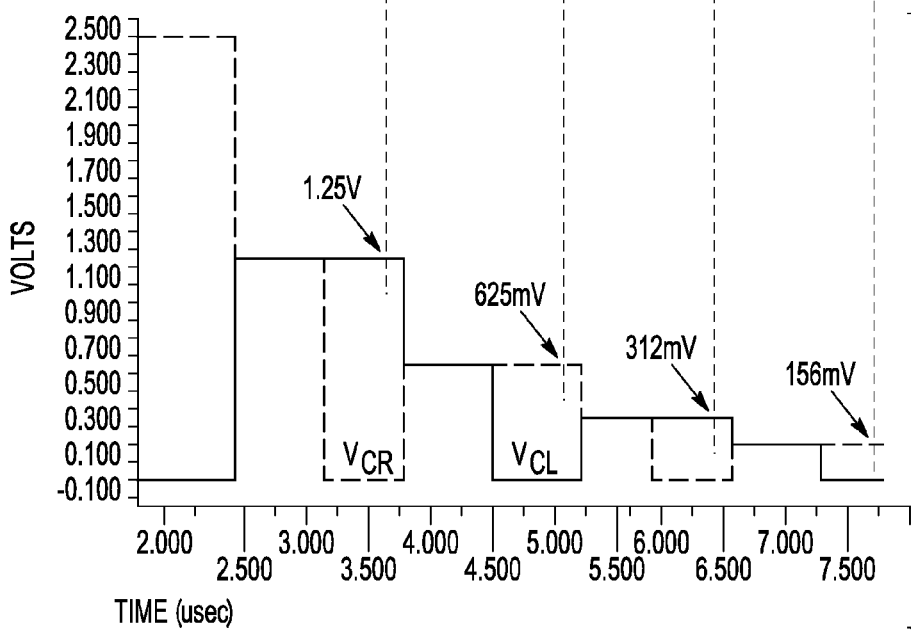
FIG. 17 illustrates, in time history diagram form, an example of voltages supplied by divider capacitors in an embodiment of the data converter of FIG. 2.

FIG. 17 illustrates, in time history diagram form, an example of voltages supplied by divider capacitors 210, 212 in an embodiment of the data converter 12 of FIG. 2, and as shown in Table 1.

| Time (µs) | $V_{CL}$ (Volts) | $V_{CR}$ (Volts) |
|---|---|---|
| 1.75 | 0 | 2.5 |
| 2.45 | 1.25 | 1.25 |
| 3.12 | 1.25 | 0 |
| 3.8 | .625 | .625 |
| 4.5 | 0 | .625 |
| 5.2 | .312 | .312 |
| 5.8 | .312 | 0 |
| 6.6 | .156 | .156 |
| 7.3 | 0 | .156 |

By now it should be appreciated that there has been provided a data converter 12 with a number of beneficial features. Data converter 12 includes a charge compensation circuit 228 that compensates or corrects fluctuations in voltages stored by capacitors 210, 212 in divider circuit 204 due to operation of transistor switch 218. Additionally, data converter 12 requires only three capacitors 206, 210, 212 having the same or approximately the same value. Capacitors 210, 212 generate $Q/2^N$ charges while capacitor 206 stores the analog data charge Qin=$C_{Discharge}V_{data}$. Amplifier 208 removes the charge from capacitor 206 and comparator 222 compares the data charges Qin with the charges of capacitors 210, 212 in divider circuit 204.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Some of the above embodiments, as applicable, may be implemented using a variety of different information processing systems. For example, although FIGS. 1 and 2 and the discussion thereof describe an exemplary information processing architecture, this exemplary architecture is presented merely to provide a useful reference in discussing various aspects of the disclosure. Of course, the description of the architecture has been simplified for purposes of discussion, and it is just one of many different types of appropriate architectures that may be used in accordance with the disclosure. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Also for example, in one embodiment, the illustrated elements of system 10 are circuitry located on a single integrated circuit or within a same device. Alternatively, system 10 may include any number of separate integrated circuits or separate devices interconnected with each other. For example, memory 18 may be located on a same integrated circuit as processor 16 or on a separate integrated circuit or located within another peripheral or slave discretely separate from other elements of system 10. Data converter 12 may also be located on a separate integrated circuit or device. Also for example, system 10 or portions thereof may be soft or code representations of physical circuitry or of logical representations convertible into physical circuitry. As such, system 10 may be embodied in a hardware description language of any appropriate type.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure is described herein with reference to specific embodiments, various modifications and changes can be made without departing from the scope of the present disclosure as set forth in the claims below. For example, any one or more of the features described herein may be used in any desired and appropriate combination with any other features. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A computer processing system comprising:
    an analog to digital converter ADC circuit that includes:
        a discharge circuit including:
            an amplifier and
            a discharge capacitor coupled to the amplifier;
        a divider circuit coupled to the discharge circuit, the divider circuit including:
            a first divider capacitor,
            a first divider switch coupled in parallel to the first divider capacitor,
            a second divider capacitor coupled in parallel to the first divider capacitor and the first divider switch,
            a third divider switch coupled in series between the first divider capacitor and the second divider capacitor; and
        a charge injection compensation circuit coupled to the discharge circuit and the divider circuit;
        a comparator including a first input coupled to an output of the amplifier,
        wherein the charge injection compensation circuit includes a data switch coupled in series between the output of the amplifier and the first input to the comparator.

2. The computer processing system of claim 1 wherein the charge injection compensation circuit includes:
    a voltage source coupled in parallel to the first divider capacitor.

3. The computer processing system of claim 1 wherein the charge injection compensation circuit includes:
    an input switch coupled in parallel between the first divider capacitor and the first divider switch.

4. The computer processing system of claim 2 wherein the charge injection compensation circuit includes:
    a copy switch coupled in series with the voltage source.

5. The computer processing system of claim 1 wherein
    the first divider switch is coupled between the first ground level and the third divider switch, and the first and second divider capacitors are coupled between a second ground level and the third divider switch, and
    a first input of the amplifier is coupled to a first ground level.

6. The computer processing system of claim 1 wherein
    the divider circuit is coupled to the discharge circuit via a first ground level, and
    the discharge capacitor is coupled between an output of the amplifier and the first ground level.

7. The computer processing system of claim 1 further comprising:
    a second divider switch coupled in parallel to the second divider capacitor, wherein the second divider switch is coupled between a first ground level and the third divider switch;
    a comparator including a first comparator input and a second comparator input, wherein the first comparator input is coupled to the output of the amplifier and the second comparator input is coupled to an output of the divider circuit.

8. The computer processing system of claim 7 further comprising:
a fourth switch coupled to the second comparator input, the fourth switch including one terminal coupled between the first divider capacitor and the third divider switch, and a second terminal coupled between the second divider capacitor and the third divider switch.

9. The computer processing system of claim 1 wherein the first and second divider capacitors generate successive $Q/2^N$ charges that are removed from the discharge capacitor through the amplifier.

10. A method for converting an analog signal to a digital signal in a processing system comprising:
performing N successive analog subtractions from an initial data charge Qin, wherein the analog subtractions are performed using an amplifier coupled to a discharge capacitor and a divider circuit coupled to an input of the amplifier, and the divider circuit includes a first capacitor, a second capacitor, and a switch to alternately divide a remaining charge Q by $2^N$ between the first and second capacitors until the remaining charge Qin at the amplifier is below a threshold value; and
compensating for fluctuations in the charge held by the first and second capacitors due to operation of the switch by operating a data switch to connect a comparator to an output of the amplifier.

11. The method of claim 10 wherein the compensating for fluctuations includes operating an input switch to open a connection to the first capacitor.

12. The method of claim 10 further the compensating for fluctuations further includes operating a copy switch and a voltage source coupled in parallel to the first capacitor.

13. The method of claim 10 wherein:
a p-input switch is coupled between the first divider capacitor and the first divider switch,
a m-input switch is coupled between the second divider capacitor and the second divider switch,
a copy switch is coupled in series with the voltage source;
a comparator including a first input is coupled to an output of the amplifier, and
a data switch is coupled in series between the output of the amplifier and the first input to the comparator.

14. A semiconductor device comprising:
a discharge capacitor;
an amplifier coupled to the discharge capacitor;
a divider circuit coupled to the amplifier and the discharge capacitor; and
a compensation circuit coupled to the divider circuit and the amplifier that includes
a p-input switch coupled between a p-input to a comparator and the divider circuit,
a m-input switch coupled between a m-input to the comparator and the divider circuit,
a copy switch coupled in series with the voltage source between p-input switch and data switch, and
a data switch coupled in series between an output of amplifier and the p-input to comparator.

15. The semiconductor device of claim 14, the divider circuit further comprising:
a third divider switch; and
first and second divider capacitors,
wherein the first divider switch is coupled between a first ground level and the third divider switch, and the first and second divider capacitors, are coupled between a second ground level and the third divider switch,
a first input of the amplifier is coupled to a first ground level,
the divider circuit is coupled to the discharge capacitor via a first ground level,
the discharge capacitor is coupled between an output of the amplifier and the first ground level.

16. The semiconductor device of claim 14 further comprising:
a comparator including a first comparator input and a second comparator input, wherein the first comparator input is coupled to the output of the amplifier and the second comparator input is coupled to an output of the divider circuit; and
the divider circuit further comprises:
a third divider switch;
first and second divider capacitors;
a second divider switch coupled in parallel to the second divider capacitor, wherein the second divider switch is coupled between a first ground level and the third divider switch; and
a fourth switch coupled to the second comparator input, the fourth switch including one terminal coupled between the first divider capacitor and the third divider switch, and a second terminal coupled between the second divider capacitor and the third divider switch.

17. The semiconductor device of claim 14 wherein the divider circuit generates successive $Q/2^N$ charges that are removed from the discharge capacitor through the amplifier.

18. The semiconductor device of claim 14 further comprising:
a comparator coupled to the amplifier and the divider circuit, wherein the divider circuit includes a first capacitor, a second capacitor, and a switch that is operated to alternately divide a remaining charge Q by $2^N$ using the first and second capacitors until the charge Qin at the amplifier is below a threshold value in the process of converting analog data to digital data.

* * * * *